US010640672B2

(12) United States Patent
Ge et al.

(10) Patent No.: US 10,640,672 B2
(45) Date of Patent: May 5, 2020

(54) ACRYLIC PHOTOVOLTAIC MODULE BACKSHEET

(75) Inventors: Jiaxin Jason Ge, Lower Providence, PA (US); Rong Maria Hu, Norristown, PA (US); Mark A. Aubart, West Chester, PA (US); Robert A. Wanat, Langhorne, PA (US)

(73) Assignee: Arkema France, Colombes (FR)

( * ) Notice: Subject to any disclaimer, the term of this patent is extended or adjusted under 35 U.S.C. 154(b) by 0 days.

(21) Appl. No.: 13/254,097

(22) PCT Filed: Mar. 1, 2010

(86) PCT No.: PCT/US2010/025733
§ 371 (c)(1),
(2), (4) Date: Aug. 31, 2011

(87) PCT Pub. No.: WO2010/101811
PCT Pub. Date: Sep. 10, 2010

(65) Prior Publication Data
US 2011/0315189 A1 Dec. 29, 2011

Related U.S. Application Data

(60) Provisional application No. 61/157,022, filed on Mar. 3, 2009, provisional application No. 61/172,390, filed on Apr. 24, 2009.

(51) Int. Cl.
*C09D 133/12* (2006.01)
*B32B 27/20* (2006.01)
(Continued)

(52) U.S. Cl.
CPC .............. *C09D 133/12* (2013.01); *B32B 7/12* (2013.01); *B32B 27/08* (2013.01); *B32B 27/16* (2013.01); *B32B 27/18* (2013.01); *B32B 27/20* (2013.01); *B32B 27/304* (2013.01); *B32B 27/306* (2013.01); *B32B 27/308* (2013.01); *B32B 27/32* (2013.01); *B32B 27/322* (2013.01); *B32B 27/36* (2013.01); *H01L 31/049* (2014.12); *B29C 65/02* (2013.01); *B29C 66/71* (2013.01); *B29C 66/919* (2013.01); *B29C 66/91411* (2013.01); *B29C 66/91935* (2013.01); *B29C 66/91943* (2013.01); *B29K 2027/16* (2013.01); *B29K 2067/00* (2013.01); *B32B 2270/00* (2013.01); *B32B 2307/206* (2013.01); *B32B 2307/4026* (2013.01); *B32B 2307/416* (2013.01); *B32B 2307/546* (2013.01); *B32B 2307/558* (2013.01); *B32B 2307/712* (2013.01); *B32B 2327/12* (2013.01); *B32B 2333/04* (2013.01); *B32B 2367/00* (2013.01); *B32B 2457/12* (2013.01); *C08L 27/16* (2013.01); *C08L 51/00* (2013.01); *C08L 53/00* (2013.01); *Y02E 10/50* (2013.01); *Y10T 428/269* (2015.01)

(58) Field of Classification Search
CPC . Y02E 10/50; H01L 31/0487; H01L 31/0481; H01L 31/048; H01L 31/18; H01L 31/049; H01L 31/0422; B29C 66/91943; B29C 66/91411; B29C 66/71; B29C 66/919; B29C 66/91935; B29K 2067/00; Y10T 428/269; B32B 7/12; B32B 2333/04; B32B 2367/00; B32B 2457/12; B32B 2270/00; B32B 27/08; B32B 27/16; B32B 27/308; B32B 27/20; B32B 27/304; B32B 27/306; B32B 27/322; B32B 27/18; B32B 27/36; B32B 2307/12; B32B 2307/206; B32B 2307/416; B32B 2307/4026; B32B 2307/546; B32B 2307/558; B32B 2307/712; B32B 27/32; C09D 133/14; C08L 53/00; C08L 51/00; C08L 27/16
USPC ........................................ 136/251, 256, 259
See application file for complete search history.

(56) References Cited

U.S. PATENT DOCUMENTS

| | | | |
|---|---|---|---|
| 5,754,338 A | 5/1998 | Wilson et al. | |
| 6,444,311 B1 * | 9/2002 | Friedman et al. | ............ 428/354 |
| 6,646,196 B2 | 11/2003 | Fronek et al. | |
| 6,660,930 B1 | 12/2003 | Gonsiorawski | |
| 7,294,399 B2 | 11/2007 | Wanat et al. | |

(Continued)

FOREIGN PATENT DOCUMENTS

JP WO 2008105241 A1 * 9/2008 ............... B32B 7/12
WO WO 2007085769 A2 * 8/2007

OTHER PUBLICATIONS

Hu, Huafeng and Jie, Xiaolei, "Agricultural Solid Waste Treatment and Disposal Technology", China Agricultural University Press, pp. 243-244, Apr. 30, 2009.

*Primary Examiner* — Mayla Gonzalez Ramos
(74) *Attorney, Agent, or Firm* — Thomas F. Roland

(57) ABSTRACT

The invention relates to an acrylic layer (in the form of a coating, film or sheet) useful as part of a photovoltaic module backsheet. The acrylic layer contains at least 40 percent of one or more acrylic polymers, including an acrylic polymer matrix and optionally acrylic impact modifiers. The acrylic polymer is preferably a polymer, copolymer, or terpolymer containing at least 50 weight percent of methylmethacrylate monomer units. The acrylic layer is flexible and optionally contains high levels of white pigment. It may also contain fluoropolymers such as polyvinylidene fluoride to improve weathering, processibility and film formation. The acrylic layer adheres to a polymer support layer such as polyethylene terephthalate (PET). A preferred substrate is PET that is pre-treated to improve adhesion, but unprimed PET can also be used. The backsheet provides excellent weatherability, environmental stability and reflectivity as part of a photovoltaic module.

11 Claims, No Drawings

(51) Int. Cl.

| | |
|---|---|
| *B32B 27/36* | (2006.01) |
| *B32B 27/18* | (2006.01) |
| *B32B 27/30* | (2006.01) |
| *B32B 27/32* | (2006.01) |
| *H01L 31/049* | (2014.01) |
| *C08L 27/16* | (2006.01) |
| *B32B 27/08* | (2006.01) |
| *B32B 7/12* | (2006.01) |
| *B32B 27/16* | (2006.01) |
| *B29C 65/02* | (2006.01) |
| *B29K 27/00* | (2006.01) |
| *B29C 65/00* | (2006.01) |
| *C08L 51/00* | (2006.01) |
| *C08L 53/00* | (2006.01) |
| *B29K 67/00* | (2006.01) |

(56) References Cited

U.S. PATENT DOCUMENTS

| | | | |
|---|---|---|---|
| 2001/0045505 A1* | 11/2001 | Morizane et al. | 250/200 |
| 2004/0209057 A1* | 10/2004 | Enlow et al. | 428/220 |
| 2007/0009752 A1 | 1/2007 | Lefebvre et al. | |
| 2007/0154704 A1* | 7/2007 | Debergalis | C08J 7/047 |
| | | | 428/323 |
| 2008/0053512 A1 | 3/2008 | Kawashima | |
| 2009/0202792 A1 | 8/2009 | Truog | |
| 2009/0275251 A1* | 11/2009 | Bonnet | B29C 47/0026 |
| | | | 442/133 |
| 2010/0000601 A1 | 1/2010 | Burchill | |
| 2010/0089445 A1* | 4/2010 | Yasukawa | B32B 7/12 |
| | | | 136/256 |
| 2010/0175742 A1 | 7/2010 | Burchill et al. | |
| 2011/0232735 A1* | 9/2011 | Bizet | B32B 27/08 |
| | | | 136/256 |
| 2011/0315189 A1* | 12/2011 | Ge et al. | 136/244 |

* cited by examiner

ACRYLIC PHOTOVOLTAIC MODULE BACKSHEET

FIELD OF THE INVENTION

The invention relates to an acrylic layer (in the form of a coating, film or sheet) useful as part of a photovoltaic module backsheet. The acrylic layer contains at least 40 percent of one or more acrylic polymers, including an acrylic polymer matrix and optionally acrylic impact modifiers. The acrylic polymer is preferably a polymer, copolymer, or terpolymer containing at least 50 weight percent of methylmethacrylate monomer units. The acrylic layer is flexible and optionally contains high levels of white pigment. It may also contain fluoropolymers such as polyvinylidene fluoride to improve weathering, processibility and film formation. The acrylic layer adheres to a polymer support layer such as polyethylene terephthalate (PET). A preferred substrate is PET that is pre-treated to improve adhesion, but unprimed PET can also be used. The backsheet provides excellent weatherability, environmental stability and reflectivity as part of a photovoltaic module.

BACKGROUND OF THE INVENTION

Photovoltaic (PV) modules are made up of an outer glazing material, solar cells that are generally encapsulated in a clear packaging for protection, and a backsheet. The solar cells are made of materials known for use in solar collectors, including, but not limited to, silicon (crystalline and amorphous), cadmium indium selenide (CIS), cadmium indium gallium selenide (CIGS), and quantum dots. The back sheet is exposed to the environment on the backside of the photovoltaic module. The primary function of the back sheet is to provide electric insulation, low water vapor transmission, UV protection, and oxygen barrier properties necessary to protect the photocells (for example, silicon wafers) from degradation induced by reaction with water, oxygen and/or UV radiation. Because the photocells are generally encapsulated in ethylene vinyl acetate (EVA), or a thermoplastic encapsulant, the backsheet material should adhere well to EVA or the thermoplastic encapsulant when the components are laminated together.

Metal sheets, such as steel or aluminum have been used as backsheets in photovoltaic module. More recently polymeric materials have been used, such as TEDLAR, a polyvinyl fluoride (PVF) material from DuPont (U.S. Pat. No. 6,646,196), an ionomer/nylon alloy (U.S. Pat. No. 6,660,930), and polyethylene terephthalate (PET). PET exhibits excellent water vapor resistance at a relatively low cost; however, it is susceptible to degradation from exposure to environmental influences, such as UV and IR radiation, and ozone.

In many backsheet constructions, PET is protected by PVF films, which are tough, photo-stable, chemically resistant, unaffected by long-term moisture exposure, and adhere well to EVA after surface treatments. Typical constructions of photovoltaic back sheets are PVF/PET/PVF, PVF/Al/PVF and PVF/PET/Al/PVF multi-layered laminated films at 100 to 450 microns in thickness. Unfortunately PVF is a relatively expensive material. Further, PVF has relatively poor adhesion to PET. Adhesion is typically augmented by treatment of the polymeric surfaces to increase adhesion of the PVF film. An adhesive is needed for effective adhesion adding cost and manufacturing steps.

A polyvinylidene fluoride backsheet composition has been shown to provide performance, processing, and cost improvements over PET/PVF technology, as described in WO 08/157,159.

A thermoformable, high Tg methacrylic sheet has been proposed, especially for use in concentrating photovoltaic modules in U.S. 61/157,022.

There is a need for tough backsheet material that can be easily adhered to PET, and withstand the rigorous requirements of an effective backsheet, yet is less expensive than currently used materials.

Surprisingly, Applicant has found that an acrylic coating, film, or sheet can be easily adhered directly to PET, providing excellent weather and moisture protection at a lower cost than the currently used fluoropolymers. The PET is preferably pre-treated to improve adhesion. An additional advantage of the invention is that high levels of white pigment are easily incorporated into the acrylic material, providing excellent solar reflectance. Pigments are sometimes difficult to disperse compositions of presently used backsheet constructions, and therefore multiple layers are sometimes required for pigment incorporation, especially when large amounts of pigment are used. Such multiple-layer structures result in additional manufacturing steps and cost.

SUMMARY OF THE INVENTION

The invention relates to a multi-layer backsheet comprising an acrylic layer adhered to a polymer support layer, where the acrylic layer comprises at least 40 percent by weight of one or more acrylic polymers, where the acrylic layer is in the form of a coating, film, or sheet having a thickness of from 10 to 200 microns, and wherein the backsheet is useful as the backsheet of a photovoltaic module.

The invention further relates to a photovoltaic module having the backsheet of the invention.

DETAILED DESCRIPTION OF THE INVENTION

The invention relates to a multi-layer photovoltaic backsheet construction having an acrylic layer in the form of an acrylic coating, film, or sheet adhered to a polymer support layer.

Acrylic Layer

An acrylic layer in the form of a coating, film, or sheet is used to provide protection to the back side of a photovoltaic module. The acrylic layer could be a singular acrylic layer, or a multi-layer structure formed by two or more acrylic layers in intimate contact with each other. The acrylic layer is adhered to a support substrate—preferably facing the environment, though in some cases it may be advantageous for the acrylic layer to be on the side of the support substrate facing the solar collectors. The acrylic layer must be able to adhere to the support layer at temperatures reached during processing and at in-use temperatures reached when the PV module is operating. The acrylic layer contains at least 40 weight percent, preferably more than 50 weight percent, and may contain 60 or more weight percent of one or more acrylic polymers, including an acrylic matrix polymer and optionally acrylic impact modifiers. The acrylic layer may additionally contain one or more different additives, such as pigments, miscible polymers, and other additives.

The backsheet needs a high level of dimensional stability. The major portion of the dimensional stability comes from the support layer. The acrylic polymer layer should have either a $T_m$ of greater than 25° C., preferably greater than 40° C., and more preferably greater than 55° C. if said layer is crystalline or semi-crystalline, or a Tg of greater than 10° C. preferably greater than 40° C., more preferably greater than 40° C., and even more preferably greater than 55° C. if said layer is amorphous. Preferably the acrylic layer has either a Tm or a Tg of greater than 70° C. and it could be more preferable for the acrylic layer to have either a Tm or a Tg of greater than 85° C. In one embodiment the acrylic layer has a high Tm or Tg, with either a $T_r$, for a semi-crystalline or crystalline layer of greater than 130° C., more preferably greater than 140° C., and even as high as greater than 150° C. or 160° C., or a Tg of an amorphous acrylic layer of greater than 90° C., preferably above 95° C., and more preferably above 100° C. The acrylic layer could even be a high Tg acrylic copolymer.

By "high Tg" as used herein means a Tg of greater than that of polymethylmethcrylate, preferably 110° C. or greater, more preferably 115° C. or greater, even more preferably 120° C. or greater, and could even be as high as 125° C. or greater as measured by differential scanning calorimetry. The high Tg composition can be either a) a high Tg copolymer composed of methyl methacrylate and at least one other monomer, in which the resulting copolymer has a Tg greater than that of poly(methyl methacrylate) (PMMA, Tg of 105° C.), or b) a blend of an (meth)acrylic polymer and at least one miscible, semi-miscible, or compatible polymer, in which the overall Tg (for a miscible polymer) or at least one of the Tgs (for a semi-miscible polymer) is greater than 110° C., or c) poly(methyl methacrylate) having a higher level of syndiotacticity than randomly polymerized PMMA.

The acrylic matrix polymer of the invention is an acrylic homopolymer or copolymer. By "copolymer" as used herein means a polymer having two or more different monomer units. The copolymer could be a terpolymer with three or more different monomer units, or have four or more different monomer units. The copolymer may be a random copolymer, a gradient copolymer, or a block copolymer formed by a controlled polymerization process. The copolymer could also be a graft copolymer, or have a controlled structure such as a star or comb. Preferably, the copolymer is formed by a free radical polymerization process or an anionic polymerization process, and the process can be any polymerization method known in the art, including but not limited to emulsion, solution, suspension polymerization, and can be done in bulk, and semi-bulk.

The acrylic matrix homopolymer or copolymer preferably contains at least 50 weight percent of methyl methacrylate monomer units, preferably at least 70 weight percent and more preferably at least 85 weight percent methylmethacrylate monomer units. The acrylic copolymers contain from 0.01 to 50, preferably 3 to 25, and more preferably 4 to 15 weight percent of at least one co-monomer. Useful monomers that can impart a higher Tg to a copolymer include, but are not limited to, methacrylic acid, acrylic acid, itaconic acid, substituted styrenes, alpha methyl styrene, maleic anhydride, isobornyl methacrylate, norbornyl methacrylate, t-butyl methacrylate, cyclohexyl methacrylate, phenyl methacrylate, acrylamide, N-isopropylacrylamide, methacrylamide, substituted maleimides, glutarimide, and maleimide.

The methyl methacrylate copolymer may additionally contain one or more other vinyl monomers copolymerizable with methyl methacrylate, including but not limited to other acrylate and methacrylate monomers or other ethylenically unsaturated monomers, including but not limited to, styrene, alpha methyl styrene, and acrylonitrile. Other methacrylate and acrylate monomers useful in the monomer mixture include, but are not limited to, methyl acrylate, ethyl acrylate and ethyl methacrylate, butyl acrylate, iso-octyl methacrylate and acrylate, lauryl acrylate and lauryl methacrylate, stearyl acrylate and stearyl methacrylate, isobornyl acrylate and methacrylate, methoxy ethyl acrylate and methacrylate, 2-ethoxy ethyl acrylate and methacrylate, dimethylamino ethyl acrylate and methacrylate monomers.

In one embodiment, small levels of multifunctional monomers as crosslinking agents may also be used. Suitable crosslinking monomers include but are not limited to, for example, allyl methacrylate, allyl acrylate, divinylbenzene, ethylene glycol dimethacrylate and diacrylate, ethylene glycol triacrylate and trimethacrylate, butylene glycol dimethacrylate, glycidyl methacrylate, triallyl isocyanurate, N-hydroxymethyl acrylamide, N,N-methylene diacrylamide and dimethacrylamide, triallyl citrate, trimethylolpropane triacylate, trimethylolpropane trimethacrylate, diethyleneglycol divinyl ether, and the like. Crosslinking by irradiation or thermal means could be used to form crosslinks after the acrylic polymer is applied to the PET.

The choice of monomers in the acrylic polymer can depend on the additives to be added into the acrylic polymer. When highly hydrophilic pigments, such as $TiO_2$ and $BaSO_4$ nanoparticles are added, the presence of hydrophilic monomer units in the polymer will aide in a homogeneous incorporation of the pigment into the acrylic polymer matrix.

In one embodiment, the acrylic matrix is a copolymer containing at least 0.01 weight percent, and preferably from 1 to 25 weight percent, more preferably 2 to 20 weight percent of polar functionalized monomer units. The functionalization can result from the copolymerization of one or more functionalized monomers, the grafting of one or more functionalized monomers, or the post-polymerization functionalization of the acrylic polymer. The functionalization may exist as functionalized blocks in a block copolymer. Useful functionalized monomers include, but are not limited to those containing acid, anhydride, hydroxy, epoxy, and amine groups. Examples of useful functional comonomers include, but are not limited to: amine functional: N,N-dimethylaminoethyl(meth)acrylate, N,N-diethylaminoethyl (metb)acrylate, (meth)acrylamide, N,N-dimethylacrylamide, N-methylolacrylamide, N-methylaminopropyl(meth) acrylamide, N,N-dimethylaminopropyl(meth)acrylamide, N-ethylamino propyl(meth)acrylamide, N,N-diethylaminopropyl (meth)acrylamide, N-methylacrylamide or N-t-butylacrylamide or N-ethyl (meth)acrylamide or chlorides of these compounds; hydroxyl functional: 2-hydroxyethyl (meth)acrylate, hydroxypropyl(meth)acrylate, 4-hydroxybutyl (meth)acrylate, glycidyl(meth)acrylate, ethyl alpha-hydroxymethacrylate, and 2,3-dihydroxypropyl(meth)acrylate; carboxylic acid and anhydride functionality: maleic anhydride, maleic acid, substituted maleic anhydride, mono-ester of maleic anhydride, itaconic anhydride, itaconic acid, substituted itaconic anhydride, glutaric anhydride, monoester of itaconic acid, fumaric acid, fumaric anhydride, fumaric acid, substituted fumaric anhydride, monoester of fumaric acid, crotonic acid and its derivatives, acrylic acid, and methacrylic acid; cyanoalkoxyalkyl (meth)acrylates such as omega-cyanoethoxyethyl acrylate, or omega-cyanoethoxyethyl methacrylate; vinyl, monomers containing an aromatic ring and an hydroxyl group, such as vinylphenol, para-vinylbenzyl alcohol, meta-vinylphenethyl alcohol, vinyl pyrrolidone, and vinyl imidazole; and other functional monomers, allyl cellosolve, allyl carbinol, methylvinyl carbinol, allyl alcohol, methyllyl alcohol, glycidyl methacrylate, 3,4-epoxybutyl acrylate, acrylonitrile, methacrylonitrile, beta-cyanoethyl methacrylate, beta-cyanoethyl acrylate, and acrylate/methacrylates that incorporate tri-salkoxy silane alkyl pendant groups, among others. Examples of polymerizable surfactants or macromonomers with hydrophilic moieties useful in the present invention include, but are not limited to sodium 1-allyloxy-2-hydroxypropane sulfonate, phosphate methacrylate monomer, poly(ethylene glycol) methylether methacrylate, 1-methacrylamido, 2-imidazolidinone ethane.

In one embodiment the acrylic copolymer is a block copolymer of gradient polymer. The block copolymer can be made by a controlled radical polymerization (CRP) process, such as, but not limited to, atom transfer radical polymerization (ATRP), reversible addition fragmentation chain transfer polymerization (RAFT), nitroxide-mediated polymerization (NMP), boron-mediated polymerization, and catalytic chain transfer polymerization (CCT). For acrylic block copolymers, a preferred process is nitroxide-mediated polymerization. Each block could be a homopolymer or a random copolymer. In one embodiment, a useful block copolymer was polymethyl methacrylate/methacrylic acid—b-polybutyl acrylate—b-polymethyl methacrylate/methacrylic acid. One of skill in the art will recognize that other similar block copolymers may be formed within the scope of the invention. One advantage of the block copolymers is that they can provide the needed flexibility without the addition of additives, such as impact modifiers.

Impact Modifiers

The toughness and impact resistance of the acrylic matrix can optionally be improved by the addition of one or more impact modifiers. Useful impact modifiers include block copolymers, graft copolymers, and core-shell impact modifiers. The impact modifiers may be acrylic or non-acrylic in nature. In one embodiment, acrylic core-shell impact modifiers having soft butyl acrylate cores can be dispersed in the acrylic copolymer matrix. Acrylic impact modifiers have better outdoor weathering performance, as compared to impact modifiers containing butadiene comonomers. Thus acrylic impact modifiers are preferred, and along with the acrylic polymer matrix comprise the acrylic portion of the acrylic layer. The level of the impact modifier is from 0 to 50 weight percent of the acrylic polymer, and preferably from 10-30 percent by weight. The use of impact modifiers also affects the melt or solution viscosity and rheology (melt strength, shear thinning). The impact-modified acrylic copolymer allows one to improve mechanical properties, such as toughness and flexibility.

Fluoropolymer

The acrylic layer may contain, as a homogeneous blend, at least one polymer miscible/semi-miscible/compatible with the (meth)acrylic (co)polymer. One useful miscible polymer is a fluoropolymer, and especially polyvinylidene fluoride (PVDF).

A fluoropolymer may be blended into the acrylic copolymer matrix to improve properties. The fluoropolymer must be miscible, semi-miscible, or compatible with the acrylic copolymer. Useful fluoropolymers include polyvinylidene fluoride (PVDF) and polyvinyl fluoride (PVF). A useful fluoropolymer is a homopolymer or copolymer of PVDF, comprising at least 75 weight percent of vinylidene fluoride monomer units. The fluoropolymer can be present in the acrylic layer/fluoropolymer blend at from 40:60 to 100:0, preferably from 51:49 to 95:5, preferably from 60:40 to 95:5, and even 70:30 to 90:10, based on the total weight of the acrylic copolymer(s) and the fluoropolymer(s). The fluoropolymer could be a homopolymer, or copolymer. Copolymers and terpolymers containing at least 75 percent by weight of vinylidene fluoride monomer units are especially useful. Useful comonomers include, but are not limited to, vinyl fluoride, trifluoroethylene, tetrafluoroethylene (TFE), ethylene tetrafluoroethylene, and hexafluoropropylene (HFP). Especially useful PVDF/HFP copolymers include KYNAR FLEX 2850 and 3120 from Arkema Inc. The blend of acrylic polymer and PVDF may be formed by any known method, including the use of an acrylic-modified fluoropolymer (AMF) to form a coating, the blending of solvent solutions of an acrylic polymer and PVDF to form a coating, and the blending of the acrylic polymer and PVDF in the melt followed by melt extrusion into a film or sheet, allowing for a very cost effective means of blending PVDF into the acrylic polymer for use in a photovoltaic backsheet.

Fluoropolymers, and especially PVDF homo- and copolymers have excellent weathering performance, UV radiation resistance, solvent/moisture resistance and electrical insulation. Their use as blends in the acrylic polymer can bring improvement in these properties. The fluoropolymer blend also reduces the brittleness and improves the impact resistance of the high Tg acrylic polymer.

Pigment

The acrylic layer of the invention preferably contains from 0 to 50 weight percent of one or more pigments, based on the weight of the acrylic polymer(s). The pigments may be an inorganic or organic pigment of any color. In a preferred embodiment, the pigment(s) are white, providing a high white reflection level, improving the light harvesting efficiency, and reducing the heat build-up in a photovoltaic module. From 5-50 wt % (based on the total acrylic polymer) of white pigment, preferably 10-40, and more preferably 25-35 weight % are used in the acrylic layer. Useful white pigments include $TiO_2$, $BaSO_4$, $CaCO_3$, $Al_2O_3$ and ZnO. In one embodiment, $TiO_2$ nano-particles are used. The $TiO_2$ can be modified with $Al_2O_3$ and/or $SiO_2$ on its surface, or treated with other organic additives to aid in dispersion. The pigment can be added into the acrylic copolymer by means known in the art. In one embodiment, a one-pass compounding process can be used to form an acrylic/PVDF/$TiO_2$ nano-particles alloy by twin screw compounding. Even better dispersion of the $TiO_2$ is provided by multiple-pass compounding, and is even required depending on the particle size and surface treatment of the $TiO_2$. Hydrophilic acrylic copolymers are useful in achieving better dispersion of the hydrophilic $TiO_2$ pigments. This is important especially at high pigment loading levels. A blend of a methacrylic copolymer having a small amount of (meth)acrylic acid monomer units, a PVDF resin and nano-particle $TiO_2$ was found to generate higher diffused solar radiation reflectance in the visible (400-800 nm) and solar regions (300-1200 nm), and improve the weathering and UV blocking.

Other Additives

In one embodiment of the invention, an acrylic-based adhesive having a strong affinity to the polymer support layer is blended into the acrylic layer. This improves the adhesion of the acrylic layer directly to untreated or treated PET or other support layer.

The acrylic layer of the invention may optionally contain one or more additives in an effective amount, including but not limited to UV stabilizers at about 1-4%—which may be organic stabilizers (such as the derivatives of benzophenone, benzotriazole, and triazine) or inorganic particles for permanent UV protection (such as nano-ZnO); plasticizers; fillers; coloring agents; pigments; antioxidants; antistatic agents; surfactants; toners; lubricants; and dispersing aids.

Antioxidants at level of from 0.1 to 1.0 wt % are useful in preventing yellowing of some high Tg polymers, include those containing acid monomers. A small amount of lubricants such as stearic acid are useful as a release agent in the formations.

Reactive additives (such as cross linking agents) which could be multifunctional silanes, aziridines, maleamines, isocayanates and their combinations, can further react with functional groups in the acrylic polymers to improve the physical performance and enhance the adhesion to unprimed PET films.

In a preferred embodiment, the acrylic layer is flexible. By "flexible", as used herein, means the acrylic layer of a thickness of 100 microns or less can be bent or folded over a cylindrical rod having a diameter of 10 mm without destroying the physical or optical properties of the layer. An acrylic layer of up to 200 microns can be bent or folded over a cylindrical rod in a diameter of 100 mm without destroying the physical or optical properties of the films/sheets. The acrylic layer is not flexible if crazing, or other physical or optical change occurs.

Polymer Support Layer

The acrylic layer is directly or indirectly adhered to a polymer support layer in the photovoltaic backsheet. The support layer is used to support the acrylic layer, and may serve other functions, such as a moisture barrier, and/or dielectric layer. The polymer support layer may be a single layer, or may have a multi-layer construction with two or more materials. Examples of useful support layers of the invention include, but are not limited to polyethylene terephthalate (PET), polyethylene napthalate (PEN), functionalized polyolefins and alloys thereof. One preferred support layer is a PET layer substrate. The support layer substrate of the invention is in the form of a sheet or film, and has a thickness of from 50 to 500 um, preferably 75 to 250 microns. The substrate is typically formed by known means, such as biaxially stretching processes. It is possible to practice the invention with a non-treated support layer and still have good adhesion, such as through the use of a functionalized acrylic, support layers such as polyethylene terephthalate are generally pre-treated by means known in the art to improve adhesion, such as coating with a chemical primer, or treating with corona, and/or plasma. PET exhibits excellent water vapor resistance at a relatively low cost; however, it is susceptible to degradation from exposure to environmental influences, such as UV and IR radiation, and ozone. In the embodiments presented below, PET is used as an exemplary support layer, though one of ordinary skill in the art can easily imagine other polymeric support layers substituted for the PET.

The acrylic layer of the invention adheres to the polymer support layer to form a backsheet structure. This adhesion could be through direct contact of the acrylic layer to a treated or untreated polymer support layer. The adhesion could also be by the use of one or more tie or adhesive layers directly between the acrylic layer and polymer support layer. The adhesion of the invention also includes an indirect adhesion, in which one or more layers of material exist between the acrylic layer and polymer support layer, with each layer adhering to each other in the respective contact zones.

Constructions

The backsheet of the invention consists of the acrylic layer (A) adhered to the support layer (which will be referred to generally as PET) (P), making a structure abbreviated as "AP". In one preferred embodiment these two layers alone make up the entire backsheet construction. The invention also anticipates other composite structures having one or more additional layers. Some of the many possible constructions are listed below—though one of ordinary skill in the art, based on the description herein, could imagine other structures that are embodiments of the invention.

a) APE. This is a three-layer structure of the acrylic layer, directly attached to a layer of PET, directly attached to an EVA (ethylene-vinyl acetate) copolymer or other thermoplastic layer. The thickness of this construction is generally from 75 to 450 microns. This construction has a good adhesion to encapsulant used in PV modules. An advantage of this structure is that it includes the backsheet and also part of the middle layer of a photovoltaic module, making the assembly of the final PV module easier.

b) AP primed. This is a three-layer structure having an acrylic layer directly attached to a layer of PET, directly attached to a thin primer (1-100 micron) such as ethylene-vinyl acetate-maleic anhydride (EVA-MAH) terpolymers or other thermoplastic. This construction has good adhesion to encapsulants in PV modules. An advantage of this structure is that it is a more cost effective backsheet, making the assembly of the final PV module easier.

c) APA. This construction has an acrylic layer on both sides of a PET layer. The acrylic layer on the inside is white, and would provide improved reflectance as it is closer to the solar cells. A thin primer such as multifunctional silanes could be used for more robust adhesion to an EVA encapsulating layer. The outer acrylic layer could be white, colorless, or another color.

d) KPA. This construction has an outer layer of poly (vinylidene fluoride) such as KYNAR resin by ARKEMA, and an inner white acrylic layer. The construction combines the excellent weatherability of a PVDF outer layer, with the increased reflectance of a white acrylic layer inside the PET. A primer could be used for better adhesion of the internal layer to the EVA encapsulating layer.

e) Acrylic coated functional polyolefins. This is a two-layer structure having an acrylic layer directly attached to a thick functional polyolefin layer (400-800 um), including EPDM or EPDM derivatives. This construction has excellent adhesion to encapsulants in PV modules. An advantage of this structure is that it is also quite cost effective, making the assembly of the final PV module easier.

Backsheet Formation

The acrylic layer composition (containing the acrylic polymer and all additives) can be formed by blending the additives into the acrylic matrix polymer by means known in the art. The acrylic layer composition is then formed and applied to the polymer support layer substrate (exemplified herein by PET) by a variety of means. The PET substrate would generally be pre-treated to increase adhesion, though not required in all cases. One of skill in the art could imagine other methods of blending components and applying the acrylic composition to the PET substrate, based on the disclosure and examples provided herein.

In one method for forming the multi-layer backsheet, an acrylic composition is first blended and formed into a separate sheet or film by known processes, such as melt-extrusion, blown film, extrusion coating, extrusion lamination and/or film cast. These single layer films or sheets are generally from 10-200 microns thick, and preferably from 15 to 100 microns thick, more preferably 20 to 50 microns thick. The film/sheet could be even thicker, which for a high level of pigment would allow the level of pigment per unit of acrylic polymer to be lower—since it is the total amount of pigment, and pigment dispersion that will determine the reflectance. This would be advantageous in the manufacture, as a masterbatch of pigment/acrylic polymer would need to be less concentrated, making the masterbatch easier to produce and handle.

The sheet or film is then laminated onto the PET under external pressure (or in a vacuum) at elevated temperature (~140-150° C.). The thermal lamination temperature could be higher than the Tg of the high Tg acrylic polymer while it could be slightly lower than or close to the melting temperature of PVDF.

A second method for applying the acrylic layer composition to PET is by a coating process. The acrylic polymer and additives could be blended into an aqueous or solvent solution or dispersion, and applied onto the PET substrate by solution coating/casting, roll-coat, brush-coat, gravure coating, flexographic coating, thermal transfer coat, spray, or other known method. The coating is then dried, creating a thin acrylic composition layer on the PET. Useful coating thicknesses are from 5 to 100 microns, and preferably 15-50 um.

The acrylic could be applied to the support layer after the support layer is laminated onto the rest of the photovoltaic module. In this case, a coating can be applied to the support layer that is already laminated to the PV module, by means known in the art. One advantage of this post-lamination coating method is that the Tg or Tm of the acrylic layer can be lower, as it is not exposed to the lamination conditions.

Optionally, a thin protective polymer layer, such as PVDF or another fluoropolymer could be applied to the outside of the backsheet, facing the environment.

Properties

The acrylic/polymer support layer backsheets of the invention provide excellent long-term weathering, excellent dimensional stability (preferably less than 2% shrinkage and more preferably less than 1%), excellent light reflection/recycling, excellent moisture resistance (<2.5 g/m$^2$ day) and excellent electrical insulation (dielectric breakdown>15 KV).

The acrylic polymer layer preferably should not exhibit visible deformation such as wrinkles, bubbles and delamination in a damp heat test at 85° C./85% relative humidity for more than 1000 hrs. The coating adhesion to PET substrates is evaluated using a standard cross-hatch peel-off method (ASTM 3003/3359).

For the pigmented acrylic layers (a preferred embodiment), optical reflection of the white acrylic films should be over about 80 percent at 560 nm in the visible region.

Further, the acrylic composition layer can provide 100% UV blocking protection at 300-400 nm, as a means to protect the PET layer from UV-based degradation. Total solar reflectance is defined as the optical reflectance in the wavelength of 300-2500 nm. The desirable total solar reflectance should be high enough such as more than 60%, which can further enhance the PV module efficiency. PV module efficiency is measured in the laminated PV module under AM 1.5G (defined in ASTM E927).

PV

The photovoltaic module consists of a front glazing material, a middle layer of solar cells, and the back sheet.

The glazing material may be glass or plastic, and may optionally be coated with a thin layer of a fluoropolymer. A concentrating photovoltaic module will include lenses to concentrate solar radiation onto smaller areas of solar collectors. In one embodiment, the front glazing material may also be a high Tg methyl methacrylate copolymer, which may be the same or different from that used in the backsheet. The glazing needs to allow transmission of solar radiation in at least some usable part of the spectrum. The glazing may be clear or hazy, and may have a smooth or matte surface.

The interior solar collectors of the photovoltaic module consist of a material that is capable of converting solar radiation into electrical current. The interior layer can be composed of materials known in the art for this purpose including, but not limited to crystalline silicon, amorphous silicon, copper indium selenide (CIS), copper-indium gallium selenide (CIGS), quantum dots, cadmium telluride (CdTe), amorphous silicon/microcrystalline silicon blend.

The solar radiation collectors are generally fragile, and so are encapsulated for protection. The encapsulant can be any encapsulant known in the art. In one embodiment the encapsulant is poly(ethylene vinyl acetate), poly(ethylene-acrylic acid ionomer, silicone, polyvinyl butyral (PVB) with peroxides and stabilizers, or thermoplastic EVA alloys with functional polyolefins.

EXAMPLES

General

The films in the Examples were extruded under the following conditions: die 2 (460° F.), die 1(460° F.), adaptor (460° F.), zone 3 (450° F.), zone 2 (440° F.), zone 1 (400° F.), Melt (422° F.), motor load (15-15 AMPS), screw speed (16) and pressure (400-600 psi).

The optical reflectance was measured using a Perkin Elmer Lambda 850/800 UV/Vis or Lambda 950 spectrophotometer with an integrating sphere in an optical reflectance. The solar reflectance was measured using Solar Spectrum Reflectance at 300-2500 nm on a black background after the calibration with a white ceramic plate B75.

The Kynar®, Plexiglas®, and Altuglas®, trademarks are owned by Arkema Inc. and Arkema France, and the products bearing these marks are available from Arkema Inc. and Arkema France. ALTUGLAS HT 121 resin is a copolymer of methyl methacrylate and methacrylic acid. PLEXIGLAS V826 resin is a copolymer of methyl methacrylate and ethyl acrylate. KYNAR 740 resin is a poly(vinylidene fluoride) homopolymer.

TiO$_2$ pigments from DuPont under the trade names R103, R105, TS 6200, and R960 were used in the Examples.

Example 1 (Film)

A 25 um white optical film containing ALTUGLAS HT 121/KYNAR 740 (polyvinylidene fluoride)/TiO$_2$ (R105) was extruded at a die temperature of 440° F., at a ratio of 38/37/25, along with 3% of the UV package (containing TINUVIN 234, anti-oxidant IRGANOX 1010 and IRGAFOS 126). The TiO$_2$ particles were used at the level of 25% to improve the solar light reflection and UV blocking performance. The melt flow rate (MFR) was measured at 3.5 g/10 minutes. 25 um ALTUGLAS HT 121/KYNAR 740/TiO2 (R105) exhibited high diffused optical reflectance up to 90% at 560 mm (Solar reflectance=74.5%), along with high optical film uniformity after single-pass compounding. No yellowing in films was detected. The storage modulus measured in dynamic mechanical analysis (DMA) was at 10.5 MPa at 150° C.

Example 2 (AP)

An alloy composite was formulated based upon ALTUGLAS HT 121 acrylic/Kynar740/TiO$_2$ (R105) (38/37/25). The white hybrid polymer composite was dissolved in N-Methylpyrrolidone (NMP) and coated onto selected 125 um DuPont pretreated Melinex 454 PET films. After the coated AP sheet samples were dried, the adhesion to the PET substrate was measured in a standard X-hatch peel-off test, and found to be excellent. For the high Tg acrylic alloy coated PET sheets, the low thermal shrinkage at 150° C. was <1.0% and 0.5% along the MD and TD directions. In addition to the excellent UV blocking, the white hybrid alloy coated PET sheets exhibited high reflectance at both the visible light and solar region, at the coating thickness of 20 um. Performance data are shown in Table 1 below.

TABLE 1

| Physical Properties | Units | white alloy coated PET (TiO2) |
|---|---|---|
| Total sheet thickness | um | 145 ± 2 |
| PET thickness | um | 125 ± 1 |
| Coating thickness | um | 20 ± 1 |
| Coating composition ALTUGLAS HT 121/K740/TiO2 | wt. % | 38/37/25 |
| X-hatch adhesion to PET substrates | — | Class 5B-100% pass |
| Thermal shrinkage @ 150° C./30 min | %/% | −0.85/−0.15 (MD/TD) |
| UV blocking @ 280-400 nm | % | 100 |
| Optical reflectance at 560 nm | % | 86.1-86.8 |
| Total solar reflectance | % | 70.9-71.9 |

Example 3 (Film)

A 35 um white optical film containing ALTUGLAS HT 121/KYNAR 740/TiO$_2$ (R105) was extruded at a die temperature of 450° F. ALTUGLAS HT 121/KYNAR 740/TiO$_2$ (R105) possessed the ratio of 35/34/31, along with 3% of the UV package. The melt flow rate (MFR) was measured at 3.3 g/10 minutes. 35 um ALTUGLAS HT 121/KYNAR 740/TiO$_2$ (R105) exhibited high diffused optical reflectance of up to 93% at 560 nm (Solar reflectance=79.5%). No yellowing in the films was detected. The storage modulus in dynamic mechanical analysis (DMA) was measured at 14.3 MPa at 150° C. (or 26.3 MPa at 140° C.).

Example 4 (AP)

An alloy composite was formulated based upon high Tg ALTUGLAS HT 121 acrylic/Kynar740/TiO$_2$ (R105) (35/34/31). To improve the solar light reflection and UV blocking performance, TiO$_2$ particles were used at the level of 30%. The white hybrid polymer composites were dissolved in NMP and coated onto selected 125 um DuPont pretreated Melinex 454 PET films. After the coated AP sheet samples were dried, the adhesion to the PET substrate was measured in a standard X-hatch peel-off test, and found to be excellent. For the high Tg acrylic alloy coated PET sheets, the low thermal shrinkage at 150° C. has been achieved <1.0% and 0.5% along the MD and TD directions. In addition to the excellent UV blocking, the white hybrid alloy coated PET sheets exhibited quite high reflectance at both of the visible light and solar region at the coating thickness of 25 um. Performance data are shown in Table 2 below.

TABLE 2

| Physical Properties | Units | white alloy coated PET (TiO2) |
|---|---|---|
| Total sheet thickness | um | 150 ± 2 |
| PET thickness | um | 125 ± 1 |
| Coating thickness | um | 25 ± 1 |
| Coating composition ALTUGLAS HT 121/K740/TiO2 | wt. % | 35/34/31 |
| X-hatch adhesion to PET substrates | — | Class 5B-100% pass |
| Thermal shrinkage @ 150° C./30 min | %/% | −0.90/−0.20 (MD/TD) |
| UV blocking @ 280-400 nm | % | 100 |
| Optical reflectance at 560 nm | % | 89.1-89.9 |
| Total solar reflectance | % | 74.5-75.5 |

Acrylic Block Polymers

Example 5 (AP)

A white acrylic film resin was compounded at the ratio of acrylic polymer/TiO$_2$ (75/25), with 3% of the UV package of example 1 and thermal processing stabilizers. The acrylic polymer was based on a high Tg p(MMA-MAA)-b-PBA-b-p(MMA-MAA) block copolymer made at Arkema, France. To improve the solar light reflection and UV blocking performance, TiO$_2$ particles (R960 from Du Pont) were compounded into the block copolymer matrix at a level of 25 wt. %. The white hybrid polymer nano-composite was dissolved in MIBK/MEK (20/80) mixture and coated onto 125 um pretreated PET films (Melinex 504 from Du Pont). The adhesion to the PET substrate was measured in a standard X-hatch peel-off test, and found to be excellent. For this high Tg acrylic coated PET sheet, the low thermal shrinkage at 150° C. was within 1% along the MD and TD directions. In addition to the excellent UV blocking, the white hybrid acrylic coated films/sheets exhibited high reflectance at both of the visible light and solar region at the coating thickness of 20 and 25 um. The coated PET sheets exhibited the excellent adhesion after a damp heat test at 85° C./85% RH over 1000 hours based upon the cross-hatch peel-off adhesion test. Performance data are shown in Table 3 below.

TABLE 3

| Physical Properties | Units | 20 um white acrylic film over 125 um PET | 25 um white acrylic film over 125 um PET |
|---|---|---|---|
| Total sheet thickness | um | 145 ± 2 | 150 ± 2 |
| PET thickness | um | 125 ± 1 | 125 ± 1 |
| Tg of the hybrid coating layer | ° C. | 130 | 130 |
| X-hatch adhesion to PET substrates | — | Class 5B-100% pass | Class 5B-100% pass |
| Thermal shrinkage @ 150° C./30 min | %/% | −0.80/−0.15 (MD/TD) | −0.85/−0.20 (MD/TD) |
| UV blocking @ 280-400 nm | % | 100 | 100 |
| Optical reflectance at 560 nm | % | 79.8-81.8 | 83.9-85.2 |
| Total solar reflectance | % | 65.3-67.1 | 68.7-70.3 |

Example 6 (Acrylic Not Functionalized)

A 32 um white optical film containing ALTUGLAS V826/KYNAR 740/TiO$_2$2 (R960) was extruded at the die temperature of 440° F. ALTUGLAS V826/KYNAR 740/TiO$_2$ (R960) possessed the ratio of 38/37/25, along with 3% of the UV package. The melt flow rate (MFR) was measured at 2.6 g/10 minutes. The film exhibited good diffused optical reflectance up to 89% at 560 nm (Solar reflectance=74.4%), along with high optical film uniformity after multiple-pass compounding. The better properties were only obtained through multiple-pass compounding. No yellowing in films was detected. The storage modulus measured in dynamic mechanical analysis (DMA) was at 5.5 MPa at 150° C.

Example 7 (AP Acrylic Not Functionalized)

The alloy composite of Example 6 was dissolved in NMP at the solid content of 30% and coated onto selected 125 um DuPont pretreated PET films (Melinex 454). After the coated AP sheet samples were dried, the solar reflectance was measured at 70% from 25 um coated samples. For the acrylic alloy coated PET sheets, the low thermal shrinkage at 150° C. has been achieved <1.0% and 0.5% along the MD and TD directions. The adhesion to the PET substrate was measured in a standard X-hatch peel-off test. The adhesion to pretreated PET substrates was relatively low.

Example 8 (Film)

A 36 um white optical film containing ALTUGLAS HT 121/KYNAR 740/$TiO_2$ (R105) at a ratio of 28/41/31 was extruded at a die temperature of 450° F., along with 3% of the UV package. The melt flow rate (MFR) was measured at 3.3 g/10 minutes. The film exhibited high diffused optical reflectance up to 94% at 560 nm (Solar reflectance=80.9%). No yellowing in films was detected. The storage modulus in dynamic mechanical analysis (DMA) was measured at 5.9 MPa at 150° C. (or 10.8 MPa at 140° C.).

Example 9 (AP)

The alloy composite of Example 8 was dissolved in MEK/NMP (50/50) at the solid content of 30% and coated onto selected 125 um DuPont Melinex 454 pretreated PET films. After the coated AP sheet samples being dried, the adhesion to the PET substrate was measured in a standard X-hatch peel-off test, and found to be excellent. For the high Tg acrylic alloy coated PET sheets, a low thermal shrinkage at 150° C. was found to be <1.0% and 0.5% along the MD and TD directions. In addition to the excellent UV blocking, the white hybrid alloy coated PET sheets exhibited high reflectance at both of the visible light and solar region at the coating thickness of 19 um. Performance data are shown in Table 4 below.

TABLE 4

| Physical Properties | Units | white alloy coated PET (TiO2) |
| --- | --- | --- |
| Total sheet thickness | um | 144 ± 2 |
| PET thickness | um | 125 ± 1 |
| Coating thickness | um | 19 ± 1 |
| Coating composition ALTUGLAS HT 121/K740/TiO2 | wt. % | 28/41/31 |
| X-hatch adhesion to PET substrates | — | Class 5B-100% pass |
| Thermal shrinkage @ 150° C./30 min | %/% | −0.82/−0.12 (MD/TD) |
| UV blocking @ 280-400 nm | % | 100 |
| Optical reflectance at 560 nm | % | 84.6-85.2 |
| Total solar reflectance | % | 68.6-69.7 |

Example 10 (Film)

A 37 um white optical film containing ALTUGLAS HT 121/acrylic core-shell impact modifier/KYNAR 740/$TiO_2$ (R105) at a ratio of 42/14/14/30, along with 3% of the UV package was extruded at the die temperature of 450° F. The melt flow rate (MFR) was measured at 1.3 g/10 minutes. The impact modifiers used were based on BA soft core/acrylic shell (MMA/EA-95/5) structure with the size of 90 nm in diameter from Arkema Inc. The film exhibited high diffused optical reflectance up to 94% at 560 nm (Solar reflectance=78.2%). No yellowing in films was detected.

Example 11 (AP)

The alloy composite of Example 10 was dissolved in MEK/NMP (80/20) at the solid content of 30% and coated onto selected 125 um DuPont Melinex 454 pretreated PET films. After the coated AP sheet samples were dried at 160° C., the adhesion to the PET substrate was measured in a standard X-hatch peel-off test, and was excellent. For the high Tg acrylic alloy coated PET sheets, low thermal shrinkage at 150° C. for 30 minutes was found to be <1.0% and 0.5% along the MD and TD directions. In addition to the excellent UV blocking, the white hybrid alloy coated PET sheets exhibited high reflectance at both of the visible light and solar region at the coating thickness of 25 um. The coated PET sheets exhibited the excellent adhesion after a damp heat test at 85° C./85% RH over 1000 hours based upon the cross-hatch peel-off adhesion test. Performance data are shown in Table 5 below.

TABLE 5

| Physical Properties | Units | white alloy coated PET (SIM) |
| --- | --- | --- |
| Total sheet thickness | um | 150 ± 2 |
| PET thickness | um | 125 ± 1 |
| Coating thickness | um | 25 ± 1 |
| Coating composition ALTUGLAS HT 121/K740/TiO2 | wt. % | 42/14/14/30 |
| X-hatch adhesion to PET substrates | — | Class 5B-100% pass |
| Thermal shrinkage @ 150° C./30 min | %/% | −0.75/−0.30 (MD/TD) |
| UV blocking @ 280-400 nm | % | 100 |
| Optical reflectance at 560 nm | % | 88.4-90.1 |
| Total solar reflectance | % | 72.9-73.5 |

Example 12 (Film)

A 37 um white optical film containing ALTUGLAS HT 121/acrylic core-shell impact modifier/KYNAR 740/$TiO_2$ (R103) at a ratio of 42/21/7/30, along with 3% of the UV package was extruded at the die temperature of 450° F. The melt flow rate (MFR) was measured at 0.6 g/10 minutes. The film exhibited high diffused optical reflectance up to 92% at 560 nm (Solar reflectance=75.1%). No yellowing in films was detected. The thermal decomposition temperature was detected at 300° C. for 2% weight loss in air.

Example 13 (AP)

The alloy composite was formulated based upon high Tg ALTUGLAS HT 121/acrylic core-shell impact modifier/KYNAR 740/$TiO_2$ at the ratio of 42/21/7/30 and additional UV package of 3%. The impact modifiers used were based on BA soft core/acrylic shell (MMA/EA-95/5) structure with the size of 90 um in diameter from Arkema Inc. The white hybrid polymer composites were dissolved in MEK/NMP (90/10) at the solid content of 31% to form a uniform dispersion and coated onto selected 125 um DuPont pretreated PET films (Mexlinex 454).

After coating, the AP sheet samples were dried at 150° C. Excellent adhesion to the PET substrates was shown in a standard X-hatch peel-off test. For the high Tg acid-grade acrylic alloy coated PET sheets, the low thermal shrinkage at 150° C. was <1.0% and 0.5% along the MD and TD directions. In addition to the excellent UV blocking, the white hybrid alloy coated PET sheets exhibited high reflectance at both of the visible light and solar region at the coating thickness of 25 um. The coated PET sheets exhibited the excellent adhesion after a clamp heat test at 85° C./85% RH over 1000 hours based upon the cross-hatch peel-off adhesion test. Performance data are shown in the Table 6 below.

TABLE 6

| Physical Properties | Units | white alloy coated PET (SIM) |
|---|---|---|
| Total sheet thickness | um | 150 ± 2 |
| PET thickness | um | 125 ± 1 |
| Coating thickness | um | 25 ± 1 |
| Coating composition ALTUGLAS HT 121/IM/K740/TiO2 | wt. % | 42/21/7/30 |
| X-hatch adhesion to PET substrates | — | Class 5B-100% pass |
| Thermal shrinkage @ 150° C./30 min | %/% | −0.85/−0.15 (MD/TD) |
| UV blocking @ 280-400 nm | % | 100 |
| Optical reflectance at 560 nm | % | 87.1-88.0 |
| Total solar reflectance | % | 69.6-70.8 |

Example 14 (Hard Core/Soft Shell Impact Modifier)

An alloy composite was formulated based upon high Tg ALTUGLAS HT 121 acrylic/impact modifier/$TiO_2$ R105 at the ratio of 41/23/36 and additional additives of 3%. To improve the solar light reflection and UV blocking performance, $TiO_2$ particles were used at the level of 36%. The impact modifier was based on hard acrylic core/soft shell/hard shell impact modifier from Altuglas. Then, the white hybrid polymer composites were dissolved in MEK/MIBK (85/15) to form a uniform dispersion and coated onto selected 125 um DuPont Melinex 561 pretreated PET films.

After coating, the AP sheet samples were dried at 120° C., and the adhesion to the PET substrate was measured in a standard X-hatch peel-off test, and found to be excellent. For the high Tg acid-grade acrylic alloy coated PET sheets, a low thermal shrinkage at 150° C. was achieved at <1.0% and 0.5% along the MD and TD directions. In addition to the excellent UV blocking, the white hybrid alloy coated PET sheets exhibited high reflectance at both of the visible light and solar region at the coating thickness of 25 um. The coated PET sheets exhibited the excellent adhesion after a damp heat test at 85° C./85% RH over 1000 hours based upon the cross-hatch peel-off adhesion test. Performance data are shown in Table 7 below.

TABLE 7

| Physical Properties | Units | white alloy coated PET |
|---|---|---|
| Total sheet thickness | um | 150 ± 2 |
| PET thickness | um | 125 ± 1 |
| Coating thickness | um | 25 ± 1 |
| Coating composition ALTUGLAS HT 121/IM/TiO2 | wt. % | 41/23/36 |
| X-hatch adhesion to PET substrates | — | Class 5B-100% pass |

TABLE 7-continued

| Physical Properties | Units | white alloy coated PET |
|---|---|---|
| Thermal shrinkage @ 150° C./30 min | %/% | −0.80/−0.15 (MD/TD) |
| UV blocking @ 280-400 nm | % | 100 |
| Optical reflectance at 560 nm | % | 88.9-90.2 |
| Total solar reflectance | % | 74.3-75.5 |

Example 15 (Hard Core/Soft Shell Impact Modifier)

An alloy composite was pre-compounded based upon high Tg ALTUGLAS HT 121 acrylic/impact modifier/K3120/$TiO_2$, R105 at the ratio of 38/18/7/36 and additional additives of 3%. Kynar Flex 3120 was a PVDF-HFP copolymer from Fluoropolymer, Arkema. The impact modifier was based on hard acrylic core/soft shell/hard shell impact modifier with the size of 300 nm from Altuglas. Then, the white hybrid polymer composites were dissolved in MEK/MIBK (85/15) to form a uniform dispersion at the solid content of 30% and coated onto selected 180 um DuPont Melinex 561 pretreated PET films.

After coating, the AP sheet samples were dried at 90° C. and 120° C., and the adhesion to the PET substrate was measured in a standard X-hatch peel-off test, and found to be excellent. For the alloy coated PET sheets, a low thermal shrinkage at 150° C. was achieved at <1.0% and 0.5% along the MD and TD directions. In addition to the excellent UV blocking, the white alloy coated PET sheets exhibited high reflectance of 75% at the coating thickness of 25 um. The coated PET sheets exhibited the excellent adhesion after a damp heat test at 85° C./85% RH over 1000 hours based upon the cross-hatch peel-off adhesion test. Performance data are shown in Table 8 below.

TABLE 8

| Physical Properties | Units | white alloy coated PET |
|---|---|---|
| Total sheet thickness | um | 180 ± 2 |
| PET thickness | um | 205 ± 2 |
| Coating thickness | um | 25 ± 1 |
| Coating composition ALTUGLAS HT 121/IM/TiO2 | wt. % | 38/19/7/36 |
| X-hatch adhesion to PET substrates | — | Class 5B-100% pass |
| Thermal shrinkage @ 150° C./30 min | %/% | −0.75/−0.20 (MD/TD) |
| UV blocking @ 280-400 nm | % | 100 |
| Optical reflectance at 560 nm | % | 88.9-90.2 |
| Total solar reflectance | % | 74.5-75.5 |

Example 16 (X-Linked AP with a Functional Silane)

An alloy composite was pre-compounded based upon high Tg ALTUGLAS HT 121 acrylic/impact modifier/K3120/$TiO_2$ R105 at the ratio of 40/18/6/36 and additional additives of 3%. Kynar Flex 3120 was a PVDF-HFP copolymer from Fluoropolymer, Arkema. The impact modifier was based on hard acrylic core/soft shell/hard shell impact modifier with the size of 300 nm from Altuglas. The pre-compounded white hybrid polymer composite was dissolved in MEK/MIBK (80/20). Then, 2.7 wt % of 3-glycidoxypropyl methyl diethoxy silane (from Alfa Aesar) was added to the above coating solution to form a uniform dispersion at the solid content of 31%. The solution was applied to 250 um DuPont Melinex 561 pretreated PET films.

The acrylic coated AP sheet samples were dried at 90° C. and 110° C., and the adhesion to the PET substrate was measured in a standard X-hatch peel-off test, and found to be excellent. For the alloy coated PET sheets, a low thermal shrinkage at 150° C. was achieved at <1.0% and 0.5% along the MD and TD directions. In addition to the excellent UV blocking, the white alloy coated PET sheets exhibited high reflectance of 74.8% at the coating thickness of 25 um. Performance data are shown in Table 9 below.

TABLE 9

| Physical Properties | Units | white alloy coated PET |
|---|---|---|
| Total sheet thickness | um | 250 ± 2 |
| PET thickness | um | 275 ± 2 |
| Coating thickness | um | 25 ± 1 |
| Composition ALTUGLAS HT 121/ IM/K3120/TiO2 (40/18/6/36) | gram | 13.5 |
| MEK | gram | 24 |
| MIBK | gram | 6 |
| 3-Glycidoxypropyl methyl diethoxy silane | gram | 0.38 |
| X-hatch adhesion to PET substrates | — | Class 5B-100% pass |
| Thermal shrinkage @ 150° C./30 min | %/% | −0.80/−0.20 (MD/TD) |
| UV blocking @ 280-400 nm | % | 100 |
| Optical reflectance at 560 nm | % | 88.7-90.1 |
| Total solar reflectance | % | 74.5-75.2 |

Example 17 (X-Linked AP with Aziridine)

An alloy composite was pre-compounded based upon high Tg ALTUGLAS HT 121 acrylic/impact modifier/TiO$_2$ R105 at the ratio of 43/21/36 and additional additives of 3%. The impact modifier was based on hard acrylic core/soft shell/hard shell impact modifier with the size of 300 nm from Altuglas. The pre-compounded white hybrid polymer composite was dissolved in MEK/butyl acetate (80/20). Then, 1.0 wt % of triaziridine (PZ-28 from Polyarizidine) was added to the above coating solution to form a uniform dispersion at the solid content of 33%. The solution was applied to 250 um DuPont Melinex 561 pretreated PET films.

The acrylic coated AP sheet samples were dried at 80° C., and the adhesion to the PET substrate was measured in a standard X-hatch peel-off test, and found to be excellent. For the alloy coated PET sheets, a low thermal shrinkage at 150° C. was achieved at <1.0% and 0.5% along the MD and TD directions. In addition to the excellent IN blocking, the white alloy coated PET sheets exhibited high reflectance of 74.5% at the coating thickness of 25 um. Performance data are shown in Table 10 below.

TABLE 10

| Physical Properties | Units | white alloy coated PET |
|---|---|---|
| Total sheet thickness | um | 250 ± 2 |
| PET thickness | um | 275 ± 2 |
| Coating thickness | um | 25 ± 1 |
| Composition ALTUGLAS HT 121/ IM//TiO2 (43/21/36) | gram | 12 |
| MEK | gram | 20 |
| Butyl acetate | gram | 4 |
| Triarizidine | gram | 0.12 |
| X-hatch adhesion to PET substrates | — | Class 5B-100% pass |
| Thermal shrinkage @ 150° C./30 min | %/% | −0.85/−0.25 (MD/TD) |
| UV blocking @ 280-400 nm | % | 100 |
| Optical reflectance at 560 nm | % | 88.4-90.0 |
| Total solar reflectance | % | 74.2-74.8 |

Example 18 (X-Linked AP with an Isocyanate without a Primer)

An alloy composite was pre-compounded based upon high Tg ALTUGLAS HT 121 acrylic/impact modifier/K3120/TiO$_2$ R105 at the ratio of 43/16/6/35 and additional additives of 3%. The impact modifier was based on hard acrylic core/soft shell/hard shell impact modifier with the size of 300 nm from Altuglas. The pre-compounded white hybrid polymer composite was dissolved in MEK/MIBK (80/20). Then, 10 wt. % of a crosslinking agent DESMODUR N3300A (homopolymer of hexamethyl diisocyanate from Bayer Material Science) was added to the above coating solution to form a uniform dispersion at the solid content of 32%. The solution was applied to 180 um Toray T60 unprimed PET films.

The acrylic coated AP sheet samples were dried at 130-145° C., and the adhesion to the PET substrate was measured in a standard X-hatch peel-off test, and was excellent. For the alloy coated PET sheets, a low thermal shrinkage at 150° C. was achieved at <1.0% and 0.5% along the MD and TD directions. In addition to the excellent UV blocking, the white alloy coated PET sheets exhibited high reflectance of 74.9% at the coating thickness of 28 um. Performance data are shown in Table 11 below.

TABLE 11

| Physical Properties | Units | white alloy coated PET |
|---|---|---|
| Total sheet thickness | um | 182 ± 2 |
| PET thickness | um | 210 ± 2 |
| Coating thickness | um | 28 ± 1 |
| Composition ALTUGLAS HT 121/ IM//K3120/TiO2 (43/16/6/35) | gram | 11.5 |
| MEK | gram | 20 |
| MIBK | gram | 4 |
| Dibutyltin Dilaurate | gram | 0.15 |
| DESMODUR N3300A | gram | 1.2 |
| X-hatch adhesion to PET substrates | — | Class 5B-100% pass |
| Thermal shrinkage @ 150° C./30 min | %/% | −0.85/−0.35 (MD/TD) |
| UV blocking @ 280-400 nm | % | 100 |
| Optical reflectance at 560 nm | % | 88.7-90.3 |
| Total solar reflectance | % | 74.5-75.3 |

Example 19 (AP-EVA Encapsulant)

A 150 um alloy coated PET film was formed, having a 25 um coating of ALTUGLAS HT 121 acrylic/impact modifier/Kynar740/TiO2 layer at the ratio of 42/21/7/30 as described in Example 13. The alloy coated PET sheets (AP) exhibited a total solar reflectance of ~70%. The uncoated PET side of a sheet was corona treated and was successfully laminated to a 420 um EVA (STR 15925P) encapsulating layer film to form an acrylic alloy/PET/EVA backsheet structure at 150° C. for 15 minutes using a P. Energy laminator in the lab after the surface treatment of PET films at the level of ~58-60 dyne/cm. The adhesion of the coated PET to the EVA layer was excellent.

Example 20 (APE)

A 150 um acrylic coated PET film was formed having a coating of 25 um ALTUGLAS HT 121 acrylic/impact modifier/TiO2 layer at the ratio of 41/23/36 described in Example 14. The coated PET sheets (AP) possessed the total solar reflectance of ~74.5% over the black background, with excellent adhesion of the coating to the PET film. The uncoated PET side of the acrylic coated PET sheets (AP)

exhibited excellent adhesion to a 100 um OREVAC T (modified EVA from Arkema Inc.) layer to form a 250 um acrylic/PET/EVA (APE) backsheet structure at 140° C. for 10 minutes under 20 psi in the lab without the surface treatment of the PET film.

Example 21 (AP+Primed)

A 205 um acrylic coated PET film was formed with a 30 um coating of ALTUGLAS HT 121 acrylic/impact modifier/ TiO2 layer at the ratio of 41/23/36 described in Example 14. The coated PET sheets (AP) possessed a total solar reflectance of ~78% over the black background along with excellent adhesion of the coating to the PET film. The PET side of the acrylic coated PET sheets (AP) exhibited excellent adhesion to a 20 um OREVAC T (Arkema modified EVA) primer layer to form a 225 um acrylic/PET/primer (AP+primer) backsheet structure at 140° C. in the lab without the surface treatment of the PET film. The primer layer possessed an excellent adhesion to a 420 um EVA (STR 15925P) encapsulating layer at 140° C. for 10 minutes under 20 psi.

Example 22 (APA)

A coating, made of CRP block copolymer (PMMA-MMA)-b-PBA-b-(PMMA-MAA)/TiO$_2$ at the ratio of 72/25 in MEK/MIBK described in Example 5, was applied to the surface of a 125 um pretreated PET film at 32.5 um. The acrylic coated PET sheets (AP) possessed a total solar reflectance of ~74% over the black background, along with excellent adhesion of the coating to the PET films. Then, a second layer (32.5 um) of the white coating was applied to the backside of the PET substrate to form an acrylic/PET/Acrylic (APA) backsheet structure. The 190 um coated APA backsheets possessed a total solar reflectance of ~80%. The acrylic coated PET sheets (APA) exhibited excellent adhesion to a 20 um OREVAC T (Arkema Inc., modified EVA) primer layer to form a 210 um acrylic/PET/primer (APA+primer) backsheet structure at 140° C. in the lab. The primed APA demonstrated an excellent adhesion to a 400 um EVA (STR 15925P) encapsulating layer at 140° C. for 10 minutes under 20 psi.

Example 23 (KPA)

The CRP block copolymer of Example 5: (PMMA-MMA)-b-PBA-b-(PMMA-MAA)/TiO$_2$ at the ratio of 72/25 in MEK/MIBK, was applied to the surface of 125 um pretreated PET film at a thickness of 32.5 um. The acrylic coated PET sheet (AP) possessed the total solar reflectance of ~74% over the black background, along with excellent adhesion of the coating to the PET film. This AP structure could be laminated to a 30 um KYNAR 302 PGM TR polyvinylidene fluoride film (Arkema Inc.) to form an acrylic/PET/adhesive/KYNAR film (APK) with a 10 um aromatic polyester adhesive layer during the hot lamination. The KYNAR layer is used as an external layer to further improve the weatherability while the acrylic layer could be used to improve the light recycling and enhance the PV module efficiency.

Example 24 (AP-EVA PV Module)

A 275 um alloy coated PET film based on Du Pont MELINEX 561 was formed, having a 25 um coating of ALTUGLAS HT 121 acrylic/impact modifier (B200)/ R105TiO2 layer at the ratio of 44/21/35 with 3% UV package. B200 is a soft-core/shell based impact modifier with the size of 210 nm from Functional Additives, Arkema. The solid content in the coating solution was controlled at 30 wt. % in MEK/butyl acetate (85/15). The alloy coated PET sheets (AP) exhibited a total solar reflectance of ~74%. The water vapor transmission rate was measured at 1.4 g/m$^2$ day under ASTM E96. The dielectric breakdown voltage was measured at 24.5 kV under ASTM D149.

The uncoated PET side of a sheet was corona treated up to ~58-60 dyne/cm and was successfully laminated to a 420 um EVA (STR 15925P) encapsulating layer along with a 2"×4" mono-crystalline Si cell sandwiched between two EVA layers and a textured front low iron glass cover to form a crystalline Si PV module at 150° C. for 15 minutes using a P. Energy laminator in the lab. The adhesion of the coated PET to the EVA layer was excellent. The mono-crystalline Si PV module with acrylic coated PET sheets passed a damp heat test at 85° C./85% RH over 1500 hours without seeing the significant reduction in the module efficiency ($\eta$=13.2±0.3%) measured under AM 1.5G (defined in ASTM E927).

Example 25 (AP-EVA PV Module)

A 205 um alloy coated PET film based on Du Pont MELINEX 561 was formed, having a 25 um coating of PLEXIGLAS HT 121 acrylic/impact modifier (B200)/ R105TiO2 layer at the ratio of 44/21/35 with 3% UV package. B200 is a soft-core/hard shell based impact modifier from Functional Additives, Arkema. The solid content in the coating solution was controlled at 30 wt. % in MEKIMIBK (85/15). The alloy coated PET sheets (AP) exhibited a total solar reflectance of ~74%. The uncoated PET side of a sheet was corona treated up to ~58-60 dyne/cm and was successfully laminated to a 420 um EVA (STR 15925P) encapsulating layer film along with a 2"×4" mono-crystalline Si cell sandwiched between two EVA layers and a flat front low iron glass cover to form a crystalline Si PV module at 150° C. for 15 minutes using a P. Energy laminator in the lab. The adhesion of the coated PET to the EVA layer was excellent. The mono-crystalline Si PV module with acrylic coated PET sheets passed a damp heat test at 85° C./85% RH over 1500 hours without seeing the visible reduction in the module efficiency ($\eta$=11.9±0.4%) measured under AM 1.5G.

Example 26 (AP)

A 22 um coating, made of ALTUGLAS HT 121 acrylic/ impact modifier (B200)/R105TiO2 layer at the ratio of 44/21/35 with 3% UV package described in example 24, was applied to the surface of a 250 um MELINEX 561 pretreated PET film at a coating line. The solid content of the coating solution was controlled at 30% in MEK/cyclopentanone (85/15). The coating line speed was at 20 feet/min and the dry temperature was up to 280° F. The acrylic coated PET sheets (AP) possessed a total solar reflectance of over the black background, along with excellent adhesion of the coating to the PET films. The acrylic coated PET sheets exhibited the excellent adhesion in a damp heat test at 85° C./85% RH over 1500 hours without seeing the reduction in coating adhesion.

Example 27 (AP)

A 22 um coating, made of ALTUGLAS HT 121 acrylic/ impact modifier (B200)/R105TiO2 layer at the ratio of 44/21/35 with 3% UV package, was applied to the surface of a 250 um MELINEX 561 pretreated PET film at a coating line. The solid content was controlled at 30% in MEK/cyclopentanone (85/15). The coating line speed was at 20 feet/min and the dry temperature was up to 280° F. The acrylic coated PET sheets (AP) possessed a total solar reflectance of 71% over the black background, along with excellent adhesion of the coating to the PET films The acrylic coated PET sheets exhibited the excellent adhesion in a damp heat test at 85° C./85% RH over 1500 hours without seeing the reduction in coating adhesion.

Example 28 (APA)

A 21 um coating, made of ALTUGLAS HT 121 acrylic/impact modifier (B280)/R105TiO2 layer at the ratio of 44/21/35 with 3% UV package, was applied to the surface of a 250 um MELINEX 561 pretreated PET film at a coating line. B2.80 is an impact modifier with the size of 300 um from Functional Additives, Arkema Inc. The solid content was controlled at 30% in MEK/cyclopentanone (85/15). The coating line speed was at 20 feet/min and the dry temperature was up to 280° F. The acrylic coated PET sheets (AP) possessed a total solar reflectance of ~70.5% over the black background, along with excellent adhesion of the coating to the PET films. Then, a second layer (20 um) of the white coating was applied to the backside of the PET substrate to form an Acrylic/PET/Acrylic (APA) backsheet at the same processing condition. The 291 um coated APA backsheets possessed a total solar reflectance of ~76.5%. The acrylic coated PET sheets exhibited the excellent adhesion in a damp heat test at 85° C./85% RH over 1500 hours without seeing the reduction in coating adhesion.

Example 29 (Primed APA-EVA)

The acrylic coated PET sheets (APA) described in example 25, exhibited the excellent adhesion to a 420 um EVA (STR 15925P) encapsulating layer film after the APA sheets were primed with a Dow Chemical N-β-aminoethyl-γ-aminopropyl trimethylsilane (Z-6020, ~97%) compound. The Z-6020 silane was diluted in EtOH down to the concentration of 1.5 wt. %. The APA treated with a Z-6020 silane primer was dried at 110° C. for 5 minutes. When the primed side of the APA backsheet was laminated to the EVA encapsulating layer at 150° C. for 15 minutes using a P. Energy laminator in the lab, the primed APA sheet exhibited the excellent adhesion to the EVA encapsulating layer. The Si module was made from a 2"×4" mono-crystalline Si cell, along with a textured front low iron glass cover, two EVA (STR 15925P) encapsulating layers, and the primed APA backsheet. Two laminated c-Si PV modules made in the lab possessed the module efficiency of 13.7% and 14.6% measured under AM 1.5G.

What is claimed is:

1. A photovoltaic module comprising, in order from front to back:
   a) a solar radiation transparent glazing material;
   b) one or more solar cells; and
   c) a multi-layer backsheet consisting of from front to back:
   1) a polymer support layer having a thickness of from 50 to 500 microns, wherein said polymer support layer is selected from polyethylene terephthalate (PET), and polyethylene naphthalate (PEN);
   2) as the outermost backside layer exposed to the environment, an acrylic homopolymer or copolymer layer (the acrylic layer) adhered directly to said support layer on the outer back side of said support layer, wherein said acrylic layer has a Tg of greater than 110° C., and where said acrylic layer comprises:
      a) 51 percent or greater by weight, based on the total polymer(s) in the acrylic layer of an acrylic polymer consisting of one or more acrylic polymers comprising at least 70 weight percent of methyl methacrylate monomer units;
      b) from 10 to 49 weight percent of one or more pigments, based on the weight of the acrylic polymer;
      c) optionally up to 40 weight percent of fluoropolymers, based on the total weight of the acrylic polymer and said optional fluoropolymer;
      d) optionally from 0 to 50 weight percent of impact modifiers, based on the weight of the acrylic polymer;
   and wherein said acrylic layer is in the form of one or more coatings, films, or sheets having a total thickness of from 5 to 200 microns.

2. The photovoltaic module of claim 1, wherein said pigment(s) are white pigments.

3. The photovoltaic module of claim 2, wherein said white pigment comprises $TiO_2$, ZnO, and $BaSO_4$ particles.

4. The photovoltaic module of claim 1, wherein said acrylic polymer comprises an acrylic matrix and from 0 to 50 weight percent of one or more impact modifiers, based on the total weight of acrylic polymers.

5. The photovoltaic module of claim 4, wherein said acrylic polymer comprises an acrylic matrix and from 10 to 30 weight percent of one or more acrylic impact modifiers, based on the total weight of acrylic polymers.

6. The photovoltaic module of claim 1, wherein said acrylic polymer comprises from 0.01 to 20 weight percent of functionalized monomer units.

7. The photovoltaic module of claim 6, wherein said functionalized monomer units comprise acrylic acid, methacrylic acid, or a mixture thereof.

8. The photovoltaic module of claim 1, wherein said fluoropolymer comprises a homopolymer or copolymer of polyvinylidene fluoride, comprising at least 75 weight percent of vinylidene fluoride monomer units.

9. The photovoltaic module of claim 1, further comprising one or more additional layers selected from the group consisting of an additional acrylic layer of the same or different composition, a fluoropolymer layer, an ethylene vinyl acetate (EVA) layer, and a thermoplastic layer.

10. The photovoltaic module of claim 1, wherein said acrylic polymer layer further is crosslinkable, and reactive with multi-functional groups.

11. The photovoltaic module of claim 1, wherein said acrylic layer further comprises reactive additives.

* * * * *